United States Patent

Gill et al.

[11] Patent Number: 6,055,136
[45] Date of Patent: *Apr. 25, 2000

[54] SPIN VALVE SENSOR WITH ANTIPARALLEL MAGNETIZATION OF PINNED LAYERS

[75] Inventors: Hardayal Singh Gill, Portola Valley; Bruce A. Gurney, Santa Clara, both of Calif.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/898,702

[22] Filed: Jul. 22, 1997

Related U.S. Application Data

[63] Continuation of application No. 08/526,648, Sep. 11, 1995, Pat. No. 5,701,222.

[51] Int. Cl.[7] .................................................. G11B 5/39
[52] U.S. Cl. .......................................................... 360/113
[58] Field of Search ............................ 360/113; 324/252, 324/207.21; 338/32 R, 32 H

[56] References Cited

U.S. PATENT DOCUMENTS

| | | | |
|---|---|---|---|
| 4,878,140 | 10/1989 | Gill et al. | 360/113 |
| 5,155,643 | 10/1992 | Jones, Jr. et al. | 360/113 |
| 5,206,590 | 4/1993 | Dieny et al. | 324/252 |
| 5,266,786 | 11/1993 | Mazumber | 360/113 |
| 5,287,238 | 2/1994 | Baumgart et al. | 360/113 |
| 5,315,469 | 5/1994 | McNeil | 360/119 |
| 5,406,433 | 4/1995 | Smith | 360/113 |
| 5,408,377 | 4/1995 | Gurney et al. | 360/113 |
| 5,442,508 | 8/1995 | Smith | 360/113 |
| 5,452,163 | 9/1995 | Coffey et al. | 360/113 |
| 5,465,185 | 11/1995 | Heim et al. | 360/113 |
| 5,508,868 | 4/1996 | Cheng et al. | 360/113 |
| 5,576,915 | 11/1996 | Akiyama et al. | 360/113 |

FOREIGN PATENT DOCUMENTS 7-85426  3/1995  Japan.

OTHER PUBLICATIONS

Anthony et al., "Magnetoresistance of Symmetric Spin Valve Structures", IEEE Trans. on Mags., vol. 30, No. 6, Nov. 1994, p. 3819.

Smith et al., "Dual Magnetoresistive Head . . . ", IEEE Trans. on Mags.", vol. 28, No. 5, Sep. 1992, p. 2292.

Smith et al., "Analysis of a Dual Magnetoresitive Head", IEEE Trans. on Mags", vol. 28, No. 5, Sep. 1992, p. 2295.

Primary Examiner—David L. Ometz
Attorney, Agent, or Firm—Paik Saber; William D. Gill

[57] ABSTRACT

A magnetoresistive (MR) sensor comprises a dual differential spin valve structure. Each of the spin valves comprise first (free) and second (pinned) layers of ferromagnetic material separated by a thin film layer of nonmagnetic material. The magnetization direction of the pinned layers of ferromagnetic material in each spin valve is fixed, and their magnetization is set antiparallel to each other. A current flow is produced through the MR sensor, and the variations in voltage across the MR sensor are sensed due to changes in resistance of the MR sensor produced by rotation of the magnetization in the free layers of ferromagnetic material as a function of the magnetic field being sensed.

16 Claims, 12 Drawing Sheets

SPIN VALVE SENSOR WITH ANTIPARALLEL MAGNETIZATION OF PINNED LAYERS

This is a continuation of application Ser. No. 08/526,648, filed on Sep. 11, 1995, now U.S. Pat. No. 5,701,222.

BACKGROUND OF THE INVENTION

1. Field of the Invention

This invention relates in general to magnetic sensors for reading information signals stored on a magnetic medium and, more particularly, to an improved magnetoresistive read sensor which utilizes a dual spin valve structure.

2. Description of the Prior Art

The prior art discloses a magnetic read transducer referred to as a Magnetoresistive (MR) sensor or head which has been shown to be capable of reading data from a magnetic surface at great linear densities. An MR sensor detects magnetic field signals through the resistance changes of a read element fabricated of a magnetic material as a function of the strength and direction of magnetic flux being sensed by the read element. More recently, a different, more pronounced magnetoresistive effect has been described in which the change in resistance of a layered magnetic sensor is attributed to the spin-dependent transmission of the conduction electrons between magnetic layers through a nonmagnetic layer and the accompanying spin-dependent scattering. This magnetoresistive effect is sometimes referred to as the "giant magnetoresistive" effect, or, simply, "giant magnetoresistance."

Commonly assigned U.S. Pat. No. 5,206,590 discloses an MR sensor in which the resistance between two uncoupled ferromagnetic layers separated by a nonmagnetic layer is observed to vary as the cosine of the angle between the magnetizations of the two layers and in which the direction of magnetization of one of the ferromagnetic layers is fixed. This MR sensor is referred to as a "spin valve." and is based on the giant magnetoresistive effect.

Commonly assigned U.S. Pat. No. 5,287,238 describes an MR sensor having a multilayered dual spin valve structure. This structure includes two outer layers of ferromagnetic material wherein the magnetism has a fixed orientation, and an intermediate layer of ferromagnetic material wherein the magnetization is free to rotate in response to an externally applied magnetic field.

SUMMARY OF THE INVENTION

It is a principal object of the present invention to provide a dual element magnetoresistive (MR) sensor which yields signals of opposite polarity under common mode excitation thereby resulting in rejection of common mode noise.

In accordance with the present invention, a dual MR sensor comprises first and second layered structures. Each of the layered structures comprise first and second thin film layers of ferromagnetic material separated by a thin film layer of nonmagnetic material. The direction of magnetizism in the first layer is free to rotate in response to an applied external magnetic field. The direction of magnetizism in the second layer is maintained in a fixed position and does not rotate when an external field is applied to the MR sensor. Each of the layered structures further include means for fixing the magnetization direction of the second layer ("pinned layer") of ferromagnetic material in each of the layered structures. The magnetization direction of the pinned layer of ferromagnetic material in the first layered structure is fixed in a direction antiparallel to the magnetization direction of the pinned layer of ferromagnetic material in the second layered structure. By providing a sense current flow through the MR sensor, the variations can be sensed in the resistivity of the MR sensor in response to an external magnetic field due to rotation of the magnetization in the first layer ("free layer") of ferromagnetic material in each of the layered structures.

The first and second layered structures each comprise spin valve structures, and, in a first embodiment, the free layers of ferromagnetic material in each spin valve are the outside layers of the MR structure. In an alternate embodiment, the free layers of ferromagnetic material are in the central portion of the MR sensor. The two spin valve structures are separated by a relatively thick nonmagnetic spacer layer which also serves as the read gap of the dual MR sensor.

DESCRIPTION OF THE PREFERRED EMBODIMENTS

Figure 1:
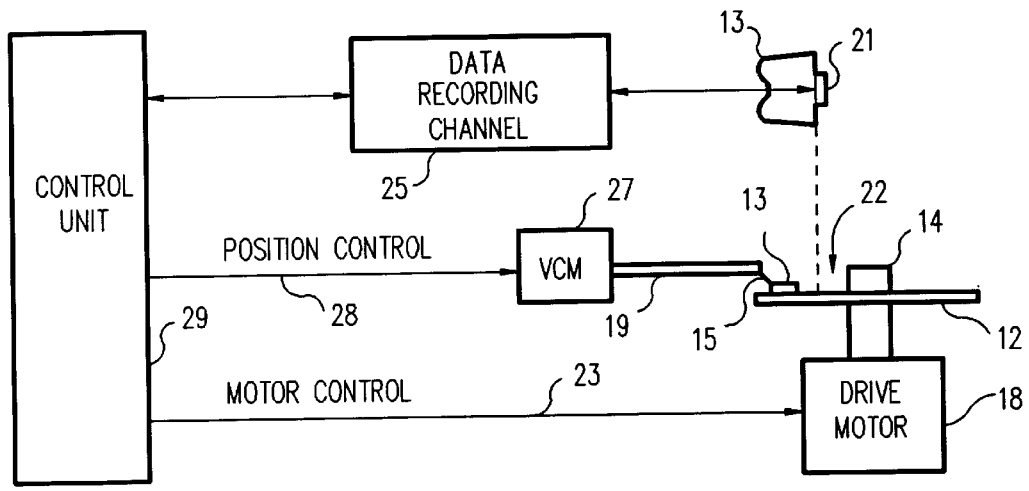
FIG. 1 is a simplified block diagram of a magnetic disk storage system embodying the present invention.

Referring now to FIG. 1, although the invention is described as embodied in a magnetic disk storage system as shown in FIG. 1, it will be apparent that the invention is also applicable to other magnetic recording systems such as a magnetic tape recording system, for example, or other applications in which a sensor is utilized to detect a magnetic field. A magnetic disk storage system comprises at least one rotatable magnetic disk 12 which is supported on a spindle 14 and rotated by a disk drive motor 18. The magnetic recording media on each disk is in the form of an annular pattern of concentric data tracks (not shown) on disk 12.

At least one slider 13 is positioned on the disk 12, each slider 13 supporting one or more magnetic read/write transducers 21, typically referred to as read/write heads. As the disks 12 rotate, the sliders 13 are moved radially in and out over the disk surface 22 so that the heads 21 may access different portions of the disk where desired data is recorded. Each slider 13 is attached to an actuator arm 19 by means of a suspension 15. The suspension 15 provides a slight spring force which biases the slider 13 against the disk surface 22. Each actuator arm 19 is attached to an actuator means 27. The actuator means as shown in FIG. 1 may be a voice coil motor (VCM), for example. The VCM comprises a coil moveable within a fixed magnetic field, the direction and velocity of the coil movements being controlled by the motor current signals supplied by a controller.

During operation of the disk storage system, the rotation of the disk 12 generates an air bearing between the slider 13 and the disk surface 22 which exerts an upward force or lift on the slider. The air bearing thus counterbalances the slight spring force of the suspension 15 and supports the slider 13 off and slightly above the disk surface by a small, substantially constant spacing during operation.

The various components of the disk storage system are controlled in operation by control signals generated by control unit 29, such as access control signals and internal clock signals. Typically, the control unit 29 comprises logic control circuits, storage means and a microprocessor, for example. The control unit 29 generates control signals to control various system operations such as drive motor control signals on line 23 and head position and seek control signals on line 28. The control signals on line 28 provide the desired current profiles to optimally move and position a selected slider 13 to the desired data track on the associated disk 12. Read and write signals are communicated to and from read/write heads 21 by means of recording channel 25.

The above description of a typical magnetic disk storage system, and the accompanying illustration of FIG. 1 are for representation purposes only. It should be apparent that disk storage systems may contain a large number of sliders.

Figure 2:
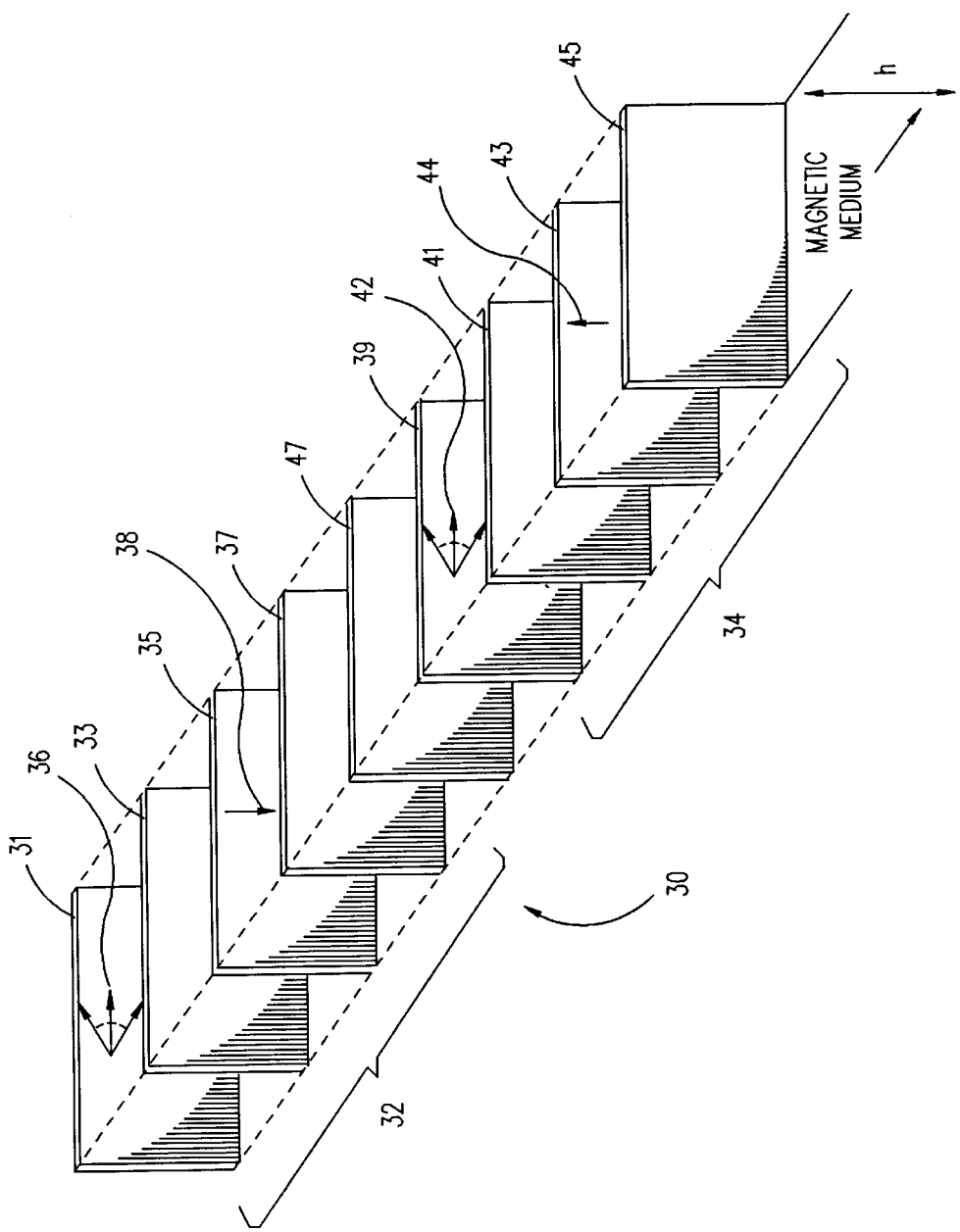
FIG. 2 is an exploded view in perspective of the dual magnetoresistive sensor according to the principles of the present invention.

Referring now to FIG. 2, a dual magnetoresistive (MR) read sensor 30, according to the present invention, includes first and second layered structures, each of which structures comprises a spin valve structure 32, 34 in which a first or "free" ferromagnetic layer 31, 39 is separated by a thin nonmagnetic spacer layer 33, 41 from a second or "pinned" ferromagnetic layer 35, 43 in which the magnetization direction is fixed. A layer 37, 45 of antiferromagnetic material is deposited adjacent and in contact with the pinned ferromagnetic layer 35, 43 to fix (i.e., pin) the magnetization direction in the pinned layer by exchange coupling. The two spin valve structures are formed on a substrate and are separated from each other by a thin layer of insulating material 47. The magnetization direction (as shown by arrows 38, 44) in the two pinned layers 35, 43 is set antiparallel so that variations in the resistivity of the magnetoresistive sensor 30 in response to an external magnetic field can be sensed differentially due to rotation of the magnetization in the free layers 31, 39 of each of the layered structures. An MR sensor based on the spin valve effect wherein the sensor read elements comprise a ferromagnetic/nonmagnetic/ferromagnetic layered structure is described in greater detail in the above-referenced U.S. Pat. No. 5,206,590 which is hereby incorporated by reference.

The magnetizations of the free layers 31, 39 of ferromagnetic material are oriented parallel to each other, i.e., in the same direction, and at an angle of about 90° with respect to the magnetization direction of the pinned layers 35, 43 of ferromagnetic material in the absence of an externally applied magnetic field as indicated by arrows 36 and 42. The magnetization direction of pinned layers 35, 43 of ferromagnetic material is fixed antiparallel as shown by arrows 38 and 44. Thus, while the magnetization directions of the pinned layers 35, 43 of ferromagnetic material remain fixed, the magnetizations in the free layers 31, 39 of ferromagnetic material are free to rotate their direction in response to an externally applied magnetic field (such as magnetic field h as shown in FIG. 2), as shown by the dashed arrows on free layers 31 and 39 in FIG. 2.

Figure 4:
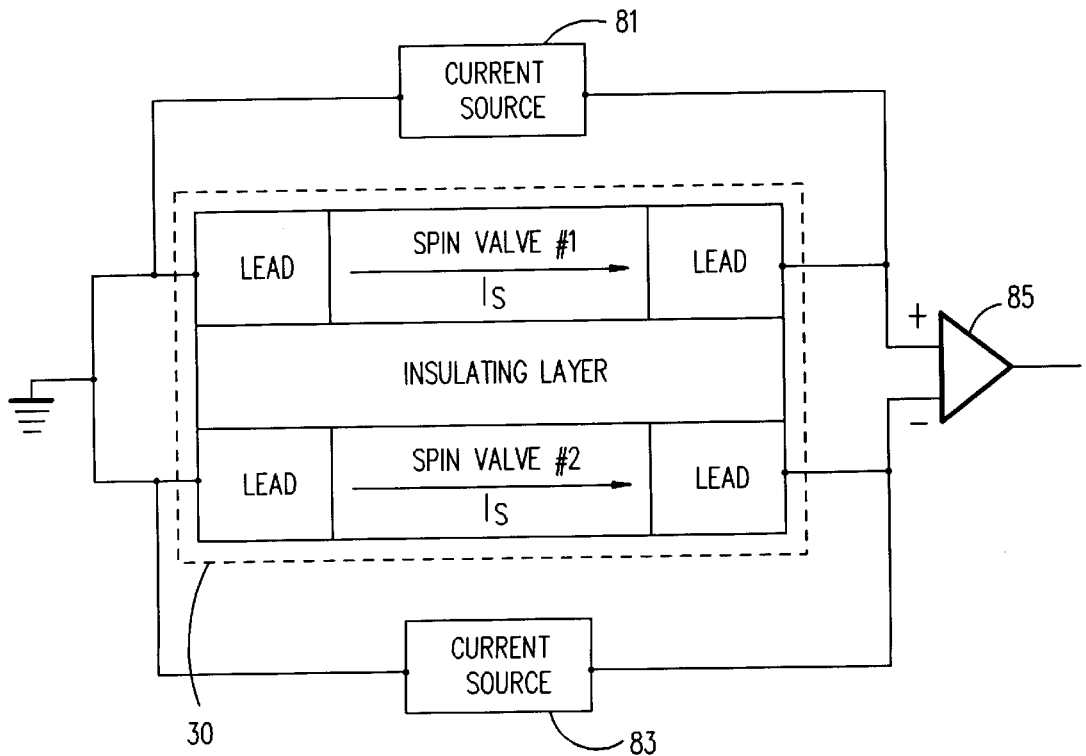
FIG. 4 is a block diagram illustrating a differential detection circuit utilizing the dual magnetoresistive sensor shown in FIGS. 3a, 3b and 3c.

It is preferred that the magnetizations in the free layers 31 and 39 of ferromagnetic material, in the absence of an externally applied magnetic field, be oriented substantially 90° to that of the pinned layers 35 and 43 of ferromagnetic material as shown in FIG. 2. This orientation produces the greatest sensitivity for the MR sensor in view of the equal excursions for both directions of rotation of the magnetization as shown by the dashed arrows in FIG. 2. To produce this orientation it is necessary to balance three competing magnetic fields which affect the magnetization direction in the free layers 31 and 39. One of these fields is the magnetostatic field from the pinned layer which reaches the free layer, another field is the interlayer coupling between the pinned and the free layers, and the third field is the magnetic field due to the sense current $I_s$ flow through the sensor (as shown in FIG. 4). It is desirable to choose the materials and thicknesses of the layers in such a way that the sense current necessary to achieve a substantially 90° orientation between the magnetization of the free and pinned layers is a value that is otherwise suitable for the application for which the sensor is to be used.

Figure 3A:
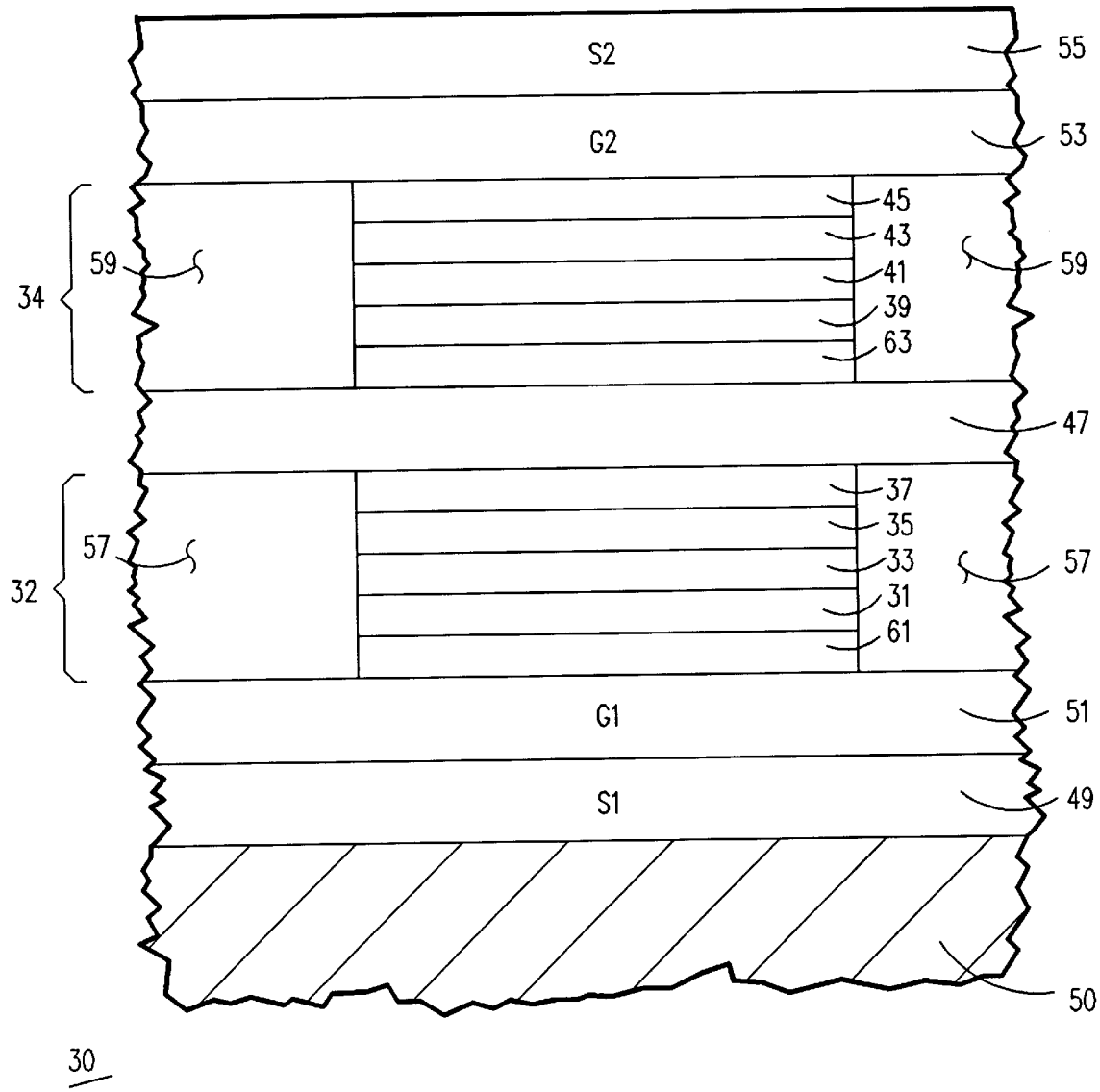
FIGS. 3a, 3b and 3c are end views from the sensor air bearing surface of the preferred embodiments of the dual magnetoresistive sensor shown in FIG. 2.
Figure 3B:
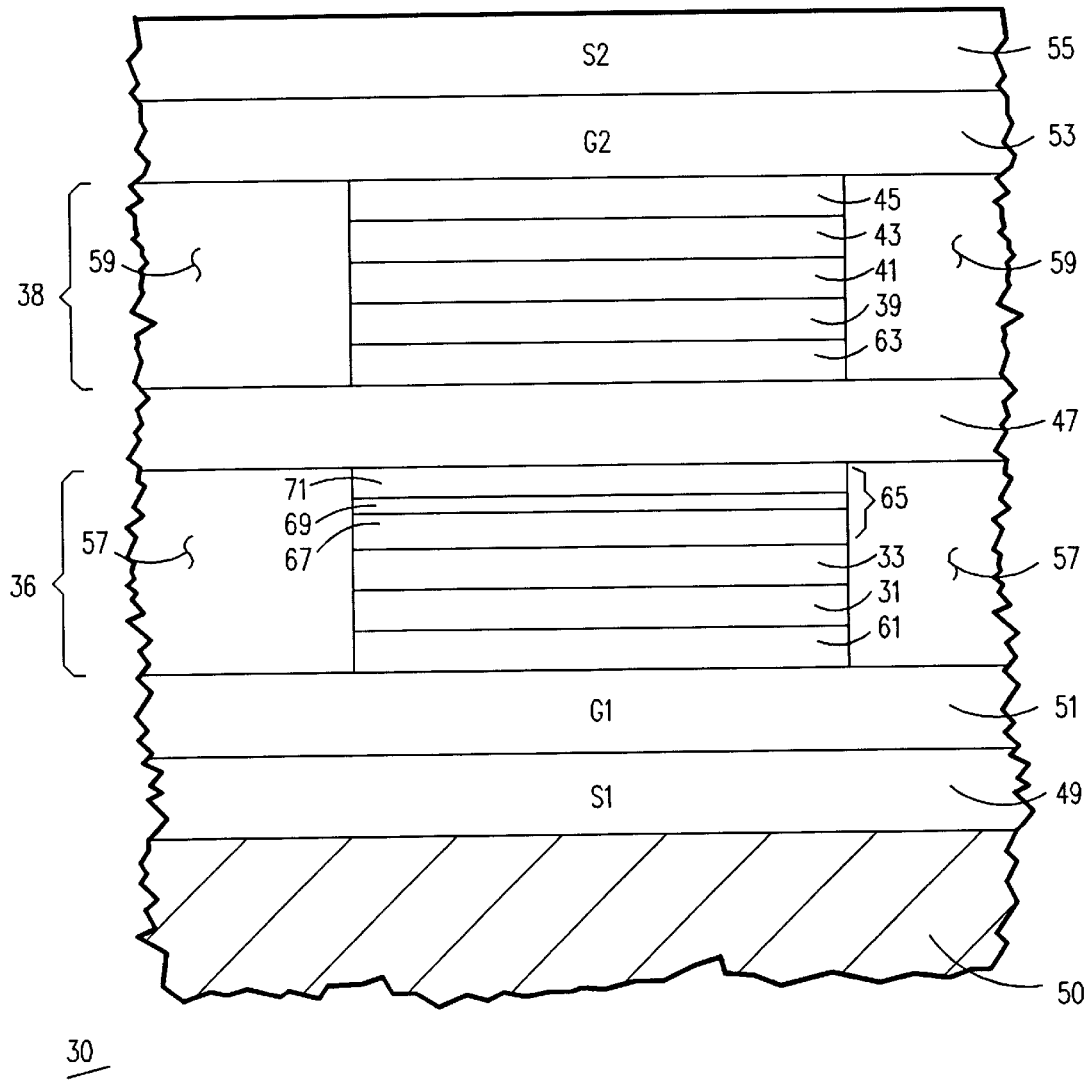
Figure 3C:
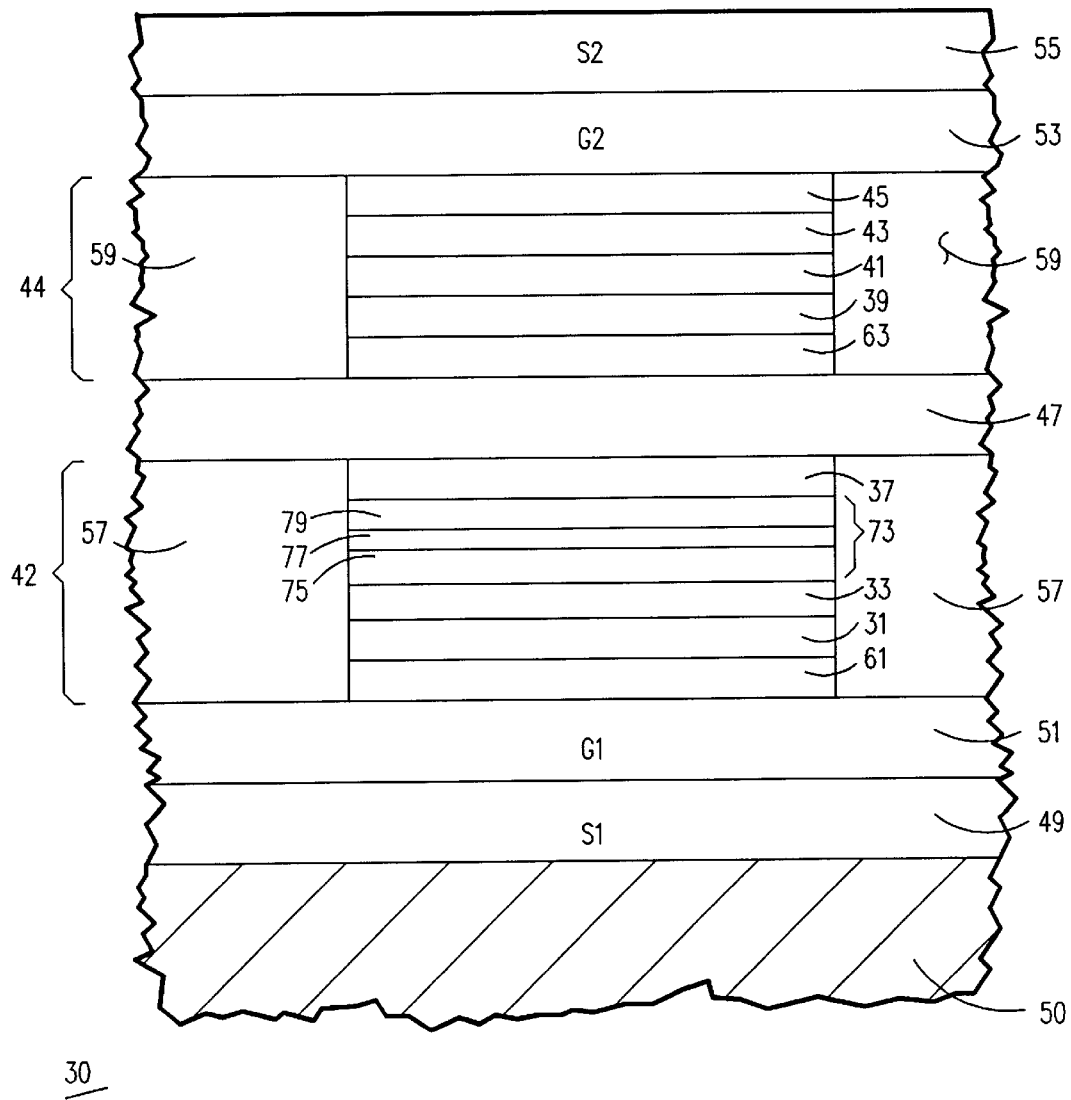

Referring now to FIGS. 3a, 3b and 3c, a preferred embodiment of the dual MR sensor of FIG. 2 is shown. The dual MR sensor 30 includes first 32 and second 34 layered structures formed on a suitable substrate 50, each of the layered structures 32, 34 comprising a spin valve structure. The spin valve structures 32, 34 are separated by a relatively thick spacer layer 47 of an insulating material which electrically isolates one spin valve structure from the other. The two spin valve structures 32, 34 are formed between two gap layers G1, G2 of insulating material which, in turn, are formed between two magnetic shield layers S1, S2 of a magnetic material. The dual MR sensor 30 is fabricated using well-known vacuum deposition and plating techniques. For example, the first shield layer 49 may be plated over the surface of substrate 50. Then, the first gap layer 51, the various layers comprising the first spin valve 32, the insulating layer 47, the various layers comprising the second spin valve 34, and the second gap layer 53 are deposited by sputtering, for example. Finally, the second magnetic shield layer 55 is plated over the second gap layer 53.

The first spin valve structure 32 comprises a first thin film layer (free layer) 31 of ferromagnetic material, a first thin film layer of nonmagnetic conductive material 33 and a second thin film layer of ferromagnetic material 35. In the specific embodiment shown in FIG. 3a, the means for fixing the magnetization direction of the second thin film layer (pinned layer) 35 of ferromagnetic material comprises a first thin film layer 37 of antiferromagnetic material. The magnetization in the second ferromagnetic layer 35 is fixed by antiferromagnetic/ferromagnetic exchange coupling. A seed layer 61 is deposited prior to deposition of the first ferromagnetic layer 31 to promote proper growth of the various succeeding layers of spin valve 32. Electrical lead conductors 57 formed at opposite ends of the spin valve structure provide electrical connection to external circuitry and define the central active region of the spin valve 32.

The second spin valve structure 34 comprises a third thin film layer (free layer) 39 of ferromagnetic material, a second thin film layer of nonmagnetic conductive material 41 and a fourth thin film layer (pinned layer) of ferromagnetic material 43. In the specific embodiments shown in FIGS. 3a, 3b and 3c, the means for fixing the magnetization direction of the fourth thin film layer 43 of ferromagnetic material comprises a second thin film layer 45 of antiferromagnetic material. The magnetization in the fourth ferromagnetic layer is fixed by antiferromagnetic/ferromagnetic exchange coupling. As described above with respect to the first spin valve structure 32, a second seed layer 63 is deposited prior to deposition of the third ferromagnetic layer 39. Similarly, electrical lead conductors 59 are formed at opposite ends of the spin valve 34.

The two spin valve structures 32, 34 are separated by a spacer layer 47 of nonmagnetic insulating material to provide electrical isolation of one spin valve from the other. A material such as aluminum oxide ($Al_2O_3$) or silicon oxide ($SiO_2$) is suitable for this purpose. The nonmagnetic spacer layer 47 also serves to magnetically decouple the free layers 31, 39 of the two spin valve structures 32, 34. The spacer layer 47 further serves as the read gap for the dual MR sensor 30.

As discussed above with reference to FIG. 2, the magnetization of the free layers 31, 39 is perpendicular to the magnetization of the pinned layers 35, 43 and, further, the magnetization of the pinned layers 35, 43 must be antiparallel with respect to each other. Since the direction or orientation of the exchange-coupled field in the pinned layers 35, 43 is set by heating the structure to a temperature greater than the Néel temperature of the antiferromagnetic material and then cooling the structure in the presence of a magnetic field having the desired direction, it is necessary that different antiferromagnetic materials having significantly different Néel temperatures be used for the two antiferromagnetic layers 37, 45, respectively. For the preferred embodiment as shown in FIG. 3a, the material for the first antiferromagnetic layer 37 can be iron-manganese (FeMn) or nickel-oxide (NiO), having, for example, a relatively low Néel temperature while the material for the second antiferromagnetic layer 45 can be nickel-manganese (NiMn), for example, having a relatively high Néel temperature.

The orientation of the exchange-coupled magnetic field in the second spin valve 34 pinned layer 43 is set by cooling the sensor 30 from a temperature greater than the Néel temperature for the material NiMn, for example, of the second antiferromagnetic layer 45 in an applied field having the desired direction. The sensor 30 is then annealed a second time at a temperature greater than the Néel temperature for the material of the first antiferromagnetic layer 37, but less than the Néel temperature for the second antiferromagnetic layer 45, while applying a magnetic field oriented antiparallel (180°) to the magnetic field applied during the first anneal process. It is preferred that the magnetization of the pinned layers 35, 43 be perpendicular to the sensor air bearing surface and the media surface, and that the magnetization of the free layers 31, 39 be parallel to the sensor air bearing surface and media surface in the quiescent state (i.e., no external magnetic field applied).

In the preferred embodiments, the ferromagnetic layers 31, 35, 39 and 43 can be fabricated of any suitable magnetic material such as cobalt (Co), iron (Fe), nickel (Ni) and their alloys such as nickel-iron (NiFe, commonly referred to as Permalloy), nickel-cobalt (NiCo) and iron-cobalt (FeCo), for example. The conductive spacer layers 33 and 41 can be of any suitable nonmagnetic conductive material such as copper (Cu), gold (Au) and silver (Ag), for example. The conductive leads 57 and 59 should be of a low electrical resistivity material (i.e., good conductor), and also exhibit hardness and good corrosion resistance as the lead material can be exposed at the sensor air bearing surface. Tantalum (Ta), for example, is a suitable material for lead conductors 57, 59. The first and second gap layers 51, 53 are of a nonmagnetic insulating material such as $Al_2O_3$ or $SiO_2$, for example. The magnetic shield layers 49, 55 are of a highly permeable magnetic material such as NiFe or Sendust (AlSiFe). In the preferred embodiment, the first shield G1 is of either NiFe or AlSiFe, while the second shield G2 is of NiFe. A specific embodiment of the dual MR sensor 30 shown in FIG. 3a has the structure, Ta(50 Å)/NiFe(90 Å)/Cu(25 Å)/Co(30 Å)/FeMn(150 Å)/$Al_2O_3$(500 Å)/Ta(50 Å)/NiFe(90 Å)/Cu(25 Å)/Co(30 Å)/NiMn(300 Å).

With continuing reference to FIG. 3b, another preferred embodiment of the dual MR sensor 30 is shown. This embodiment is similar to that described above with reference to FIG. 3a. The sensor 30 as shown in FIG. 3b comprises a first spin valve structure 36 electrically isolated from a second spin valve structure 38 by a nonmagnetic insulating spacer layer 47. While the second spin valve structure 38 is the same as the second spin valve structure 34 as shown in FIG. 3a, the first spin valve structure 36 differs from the first spin valve structure 32 as shown in FIG. 3a in the means employed to achieve the magnetization in the pinned layer 65.

The first spin valve 36 comprises a seed layer 61, a first ferromagnetic layer (free layer) 31, a first conductive spacer layer 33 and a second ferromagnetic layer (pinned layer) 65. The pinned layer 65 is a layered structure having a first layer 67 of ferromagnetic material, an antiferromagnetic coupling layer 69 of nonmagnetic material and a second layer 71 of ferromagnetic material. The spacer layer 47 is deposited directly over and in contact with the second ferromagnetic layer 71 and is of an antiferromagnetic material. An effective magnetic field is induced in the pinned layer second ferromagnetic layer 71 by exchange coupling between the ferromagnetic material of layer 71 and the antiferromagnetic material of spacer layer 47. Since the pinned layer first ferromagnetic layer 67 is antiferromagnetically coupled with the pinned layer second ferromagnetic layer 71, both layers are exchange-coupled to the antiferromagnetic spacer layer 47, producing an effective magnetic field in ferromagnetic layer 67 which is fixed in small and moderate externally applied magnetic fields.

In this preferred embodiment, as described above, the ferromagnetic layers can be of any suitable magnetic material and the conductive spacer layers 33 and 41 can be of any suitable nonmagnetic conductive material. Within the first spin valve pinned layer 65, the antiferromagnetic coupling layer 69 may be of any suitable nonmagnetic material, such as ruthenium (Ru), chromium (Cr), rhodium (Rh), iridium (Ir) or other material or their alloys known to promote antiparallel coupling between ferromagnetic layers. Since the spacer layer 47 also serves to electrically isolate the first spin valve 36 from the second spin valve 38, it must be an electrically insulating material as well as an antiferromagnetic material, such as NiO.

The use of a layered pinned layer 65 in combination with an antiferromagnetic spacer layer 47 allows antiparallel magnetic fields to be induced in the pinned layers 65 and 43 of the first and second spin valves 36 and 38, respectively, using only a single heating/cooling process at a temperature greater than the higher Néel temperature of the two antiferromagnetic materials used in the sensor. Thus, while the magnetic field induced by exchange coupling in the pinned layer second ferromagnetic layer 71 is parallel to the field induced in pinned layer 43, the field induced by magnetostatic coupling in pinned layer first ferromagnetic layer 67 adjacent conductive spacer layer 33 will be antiparallel with respect to the field in pinned layer 43.

A specific embodiment of the dual MR sensor 30 shown in FIG. 3b has the structure, Ta(50 Å)/NiFe(90 Å)/Cu(25 Å)/Co(30 Å)/Ru(4 Å)/Co(40 Å)/NiO(400 Å)/Ta(50 Å)/NiFe (90 Å)/Cu(25 Å)/Co(30 Å)/FeMn(150 Å). In order to achieve the desired antiparallel orientation of the magnetization of the pinned layers 65 and 43, the thickness of the Ru antiferromagnetic coupling layer 69 should be in the range of 4–6 Å while the first and second Co layers 67 and 71 should differ in thickness by approximately 10 Å. In the preferred embodiment, the thickness of the Ru coupling layer 69 of 4–6 Å is selected to provide large antiferromagnetic exchange coupling between the Co layers 67 and 71. For a more detailed description of this process, see Parkin et al., *Phys. Rev. Lett.*, Vol. 64, p. 2034 (1990), hereby incorporated by reference. The difference in thickness between the two Co layers 67 and 71 determines the magnetization and magnetic anisotropy of the pinned layer 65 as described in greater detail in commonly assigned U.S. Pat. No. 5,408,377, hereby incorporated by reference. The value of the net magnetization of the pinned layers 65 and 43 determine the value of the demagnetizing fields acting on the sensor free layers 31, 39. The demagnetizing fields together with the ferromagnetic coupling between the free and pinned layers 31 and 35, 39 and 43 across the nonmagnetic spacer layers 33, 41, respectively, and the field generated by the sensor bias current (the sense current) determine the quiescent bias point (i.e., the orientation of the free layer magnetization in the absence of an external field). The thickness difference of the two Co layers 67, 71 is therefore selected to achieve an optimum bias point.

With continuing reference to FIG. 3c, another preferred embodiment of the dual MR sensor 30 is shown. This embodiment is similar to that described above with reference to FIG. 3b. The sensor 30 as shown in FIG. 3c comprises a first spin valve structure 42 electrically isolated from a second spin valve structure 44 by a nonmagnetic insulating spacer layer 47 wherein the first spin valve 42 differs from the first spin valve structure 36 of FIG. 3b in the use of materials to provide the exchange-coupled magnetic field in the pinned layer 73.

The first spin valve 42 comprises a seed layer 61, a first ferromagnetic layer (free layer) 31, a first conductive spacer layer 33, a second layered ferromagnetic layer (pinned layer) 73 and a first antiferromagnetic layer 37. The pinned layer 73 includes a first ferromagnetic layer 75, a second ferromagnetic layer 79 and a antiferromagnetic coupling layer 77 separating the first and second ferromagnetic layers 75, 79. The antiferromagnetic layer 37 is deposited over and in direct contact with the pinned layer second ferromagnetic layer 79. An effective magnetic field is induced in the second ferromagnetic layer 79 by exchange coupling with the antiferromagnetic layer 37. An effective magnetic field is then induced in the pinned layer first ferromagnetic layer 75 through antiferromagnetic coupling with the pinned layer second ferromagnetic layer 79, thereby fixing the magnetization of ferromagnetic layer 75 in small and moderate externally applied fields.

As described above with reference to FIG. 3b, the use of a layered pinned layer 73 in combination with the first antiferromagnetic layer 37 allows fixed antiparallel magnetic fields to be induced in the pinned layer first ferromagnetic layer 75 and in the pinned layer 43 of the second spin valve 44 using only a single heating/cooling process.

A specific embodiment of the dual MR sensor 30 shown in FIG. 3c has the structure, Ta(50 Å)/NiFe(90 Å)/Cu(25 Å)/Co(30 ÅA)/Ru(4 Å)/Co(40 Å)/FeMn(150 Å)/Al$_2$O$_3$(500 Å)/Ta(50 Å)/NiFe(90 Å)/Cu(25 Å)/Co(30 Å)/FeMn(150 Å). The use of a single anneal process to set the magnetization in the pinned layers 731 43 eliminates the need to use different materials having different Néel temperatures for the first and second antiferromagnetic layers 37, 45. Since in this embodiment the spacer layer 47 serves only to electrically isolate the two spin valve structures 42, 44, the spacer layer may be of any suitable insulating material, such as Al$_2$O$_3$ or SiO$_2$.

Referring now also to FIG. 4, a block diagram illustrating a differential detection circuit utilizing the dual MR sensor 30 as described above with reference to FIGS. 3a, 3b and 3c is shown. A current source 81 provides a constant bias or sense current I$_s$ to spin valve number 1. Similarly, current source 83 provides a constant sense current I$_s$ to spin valve number 2. The current flows through both spin valves in the same direction. The output signal of each spin valve is applied to opposite polarity inputs, respectively, of differential amplifier 85. The antiparallel magnetization of the pinned layers in both spin valves provides opposite resistance changes in the two spin valves in response to an applied external field, such as a magnetic data signal recorded on a magnetic disk. The resistance changes and, hence, the output signal, are additive at the differential detector 85, thus providing greater sensitivity. Using differential detection also provides common mode noise rejection, such as from thermal asperities.

Figure 5:
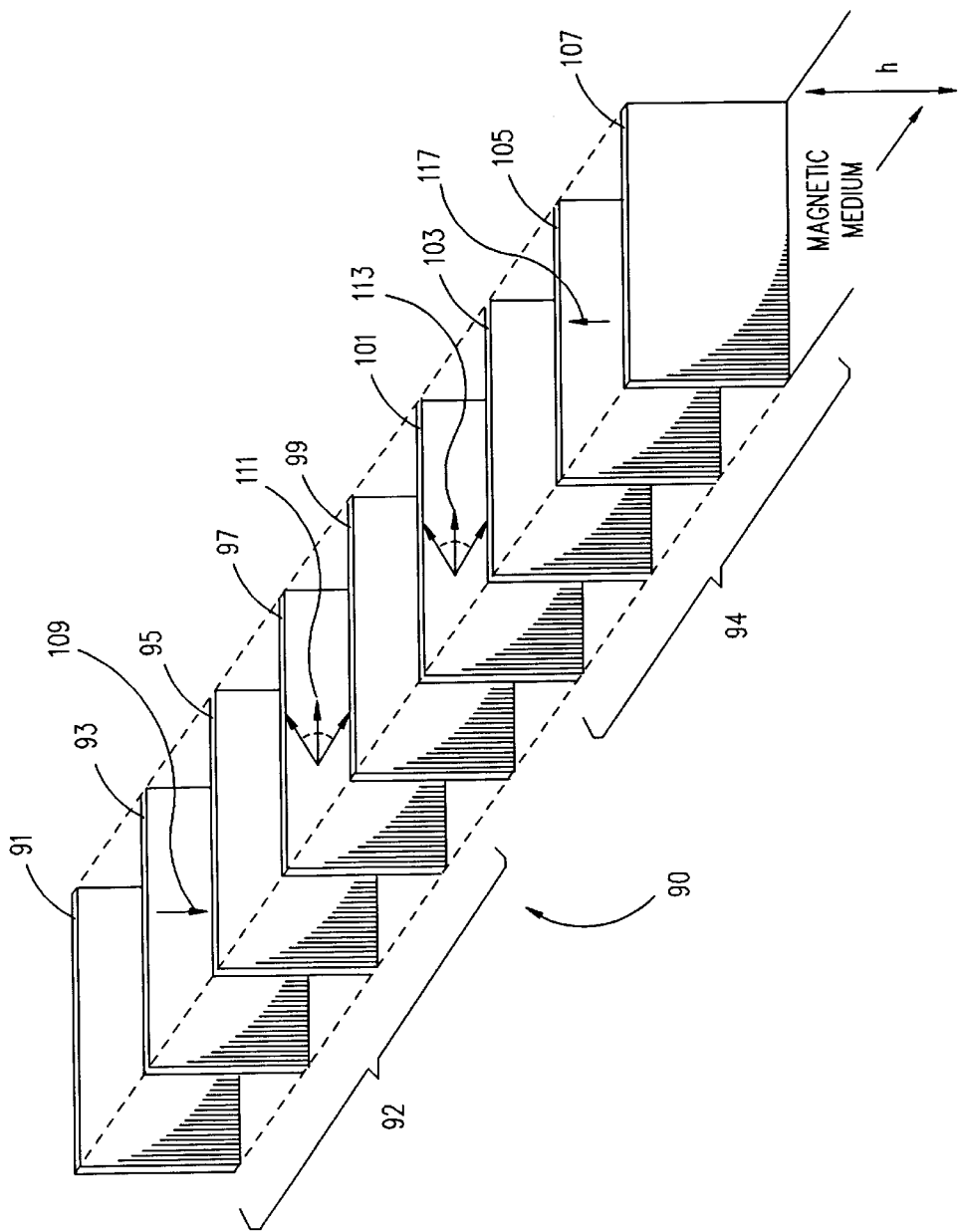
FIG. 5 is an exploded view in perspective of another embodiment of the dual magnetoresistive sensor according to the principles of the present invention.

Referring now also to FIG. 5, another preferred embodiment of the dual MR sensor according to the present invention is shown. The dual MR sensor 90 comprises a first spin valve structure 92, a second spin valve structure 94 separated by a nonmagnetic spacer layer 99 which may be of either an electrically conducting or insulating material. Each spin valve 92, 94 comprises a first (free) ferromagnetic layer 97, 101 and is separated from a second (pinned) ferromagnetic layer 93, 105 by a thin nonmagnetic electrically conductive layer 95, 103. Pinning layers 91, 107 are formed adjacent the pinned ferromagnetic layers 93, 105, respectively, to provide means for fixing the direction of magnetization in each of the pinned layers 93, 105. As discussed above with reference to FIG. 2, the magnetization direction in each pinned layer 93, 105 is fixed antiparallel with respect to the other (arrows 109, 117, respectively). The magnetization direction in each of the free ferromagnetic layers 97, 101 is set perpendicular to the magnetization direction in the pinned layers 93, 105 and is free to rotate in response to an applied external magnetic field (arrows 111, 113, respectively).

Figure 6:
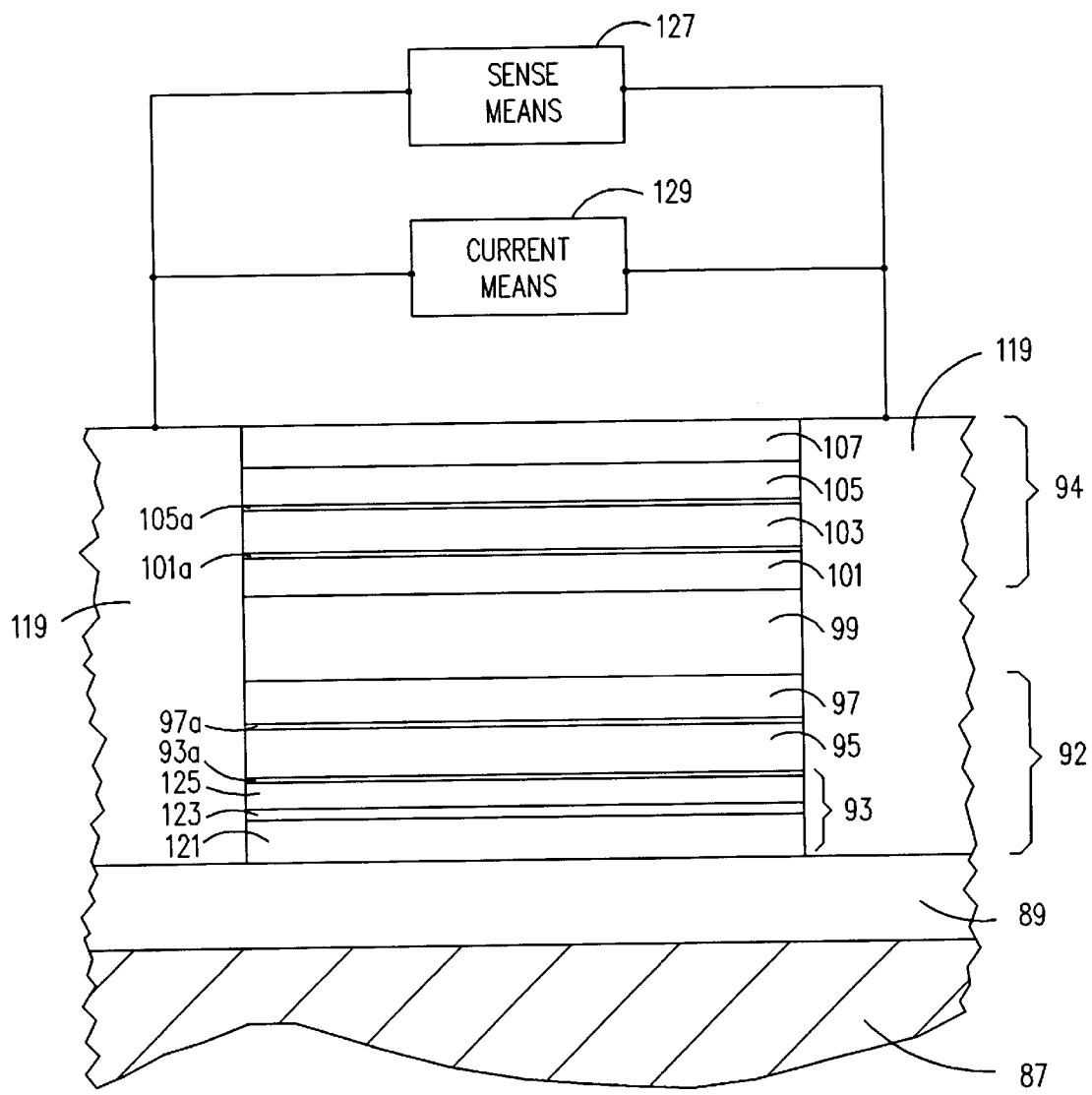
FIG. 6 is an end view from the sensor air bearing surface of the embodiment of the dual magnetoresistive sensor shown in FIG. 5.

Referring now also to FIG. 6, a specific embodiment of the dual MR sensor 90 of FIG. 5 is shown. First and second spin valve structures 92 and 94, respectively, are separated by insulating spacer layer 99 and are formed by vacuum deposition techniques on an insulating layer 89, which is formed on a suitable substrate 87. The insulating layer 89 is analogous to the first gap layer G1 as shown in FIG. 3a.

For purposes of illustration, the substrate 87 includes any additional layers as known in the art, such as the first magnetic shield layer Si as shown in FIG. 3a. The first spin valve structure 92 comprises a first ferromagnetic layer 97 (free layer) and a second ferromagnetic layer 93 (pinned layer) separated by a nonmagnetic conductive spacer layer 95. As described above with reference to FIGS. 3b and 3c, the pinned layer 93 comprises first and second ferromagnetic layers 121 and 125, respectively, separated by a thin nonmagnetic decoupling layer 123.

The insulating layer 89 is of an antiferromagnetic material such as NiO. The pinned layer first ferromagnetic layer 121 is deposited on the surface of and in direct contact with the antiferromagnetic insulating layer 89. A magnetic field is induced in the ferromagnetic layer 121 by exchange coupling with the antiferromagnetic insulating layer 89, thus providing a magnetic field in the second ferromagnetic layer 125 by magnetostatic coupling. The second spin valve structure comprises a first ferromagnetic layer 101 (free layer) and a second ferromagnetic layer 105 (pinned layer) separated by a nonmagnetic conductive spacer layer 103. An antiferromagnetic layer 107 is formed over and in contact with the second ferromagnetic layer 105 to provide a magnetic field in the pinned layer 105 by exchange coupling. It is a feature of this embodiment that the free layers 97, 101 of each spin valve are deposited at the middle of the sensor structure adjacent opposing sides of the insulating spacer layer 99. The spacer layer 99 is of a nonmagnetic (as well as electrically insulating) material to provide magnetic decoupling between the free layers 97, 101 of the two spin valves 92, 94, respectively.

Conductive leads 119 are formed at opposing ends of the spin valves 92, 94, shorting the spin valves 92, 94 together at each end and defining the sensor 90 central active region (i.e., the region of the sensor 90 which responds to an applied magnetic signal). The sensor active region also defines the sensor track width. The conductive leads 119 couple the sensor 90 to external circuitry such as current means 129 and sense means 127. Current means 129 provides a sense current $I_s$ to the sensor 90. The sense means 127 detects the sensor 90 output signal in response to an applied external magnetic field.

According to this embodiment of the invention, the ferromagnetic layers 93, 97, 101 and 105 can be fabricated of any suitable magnetic material such as Co, Fe, Ni and their alloys such as NiFe, NiCo, and FeCo, for example, with the layered ferromagnetic layer 93 being as described above. In the specific embodiment shown in FIG. 6, the ferromagnetic layers 93, 97, 101 and 105 can alternatively comprise a layer of a first ferromagnetic material such as NiFe, for example, and a thin layer, referred to as a "nanolayer", of a second ferromagnetic material such as Co, for example. The nanolayer structure is described in commonly assigned U.S. Pat. No. 5,341,261 which is hereby incorporated by reference. The nanolayer of the second ferromagnetic material is deposited at the interface between the first layer of ferromagnetic material and the nonmagnetic spacer layer. The preferred ferromagnetic layer is a thin film layer of NiFe 93 and a nanolayer of Co 93a about 7–20 Å thick. Layers of ferromagnetic material 97, 97a, 101, 101a, 105 and 105a also have this dual-layer structure. This dual-layer structure provides a greater change in resistance as well as a low coercivity and a low magnetic anisotropy. Further, this combination of magnetic parameters could not be obtained by a single layer of either of the ferromagnetic materials alone.

The nonmagnetic spacer layers 33, 38 comprise Cu, for example, or other suitable conductive metal such as Ag, Au or their alloys. Conductive leads 119 can be of any suitable electrically conductive material, such as Ta. The layer 107 of antiferromagnetic material can be FeMn or NiMn, for example. The insulating layer 89 can be of any antiferromagnetic material which is also electrically insulating, such as NiO. The use of the layered pinned layer 93 in the first spin valve 92 allows the direction of the magnetism in the pinned layers 93 and 105 to be set antiparallel with respect to each other utilizing only a single heating/cooling process. Alternatively, the magnetization direction of the pinned ferromagnetic layers 93, 105 can be fixed by the use of an adjacent hard magnetic layer or by the use of a material having a sufficiently high coercivity for the pinned layers 93, 105.

Figure 7:
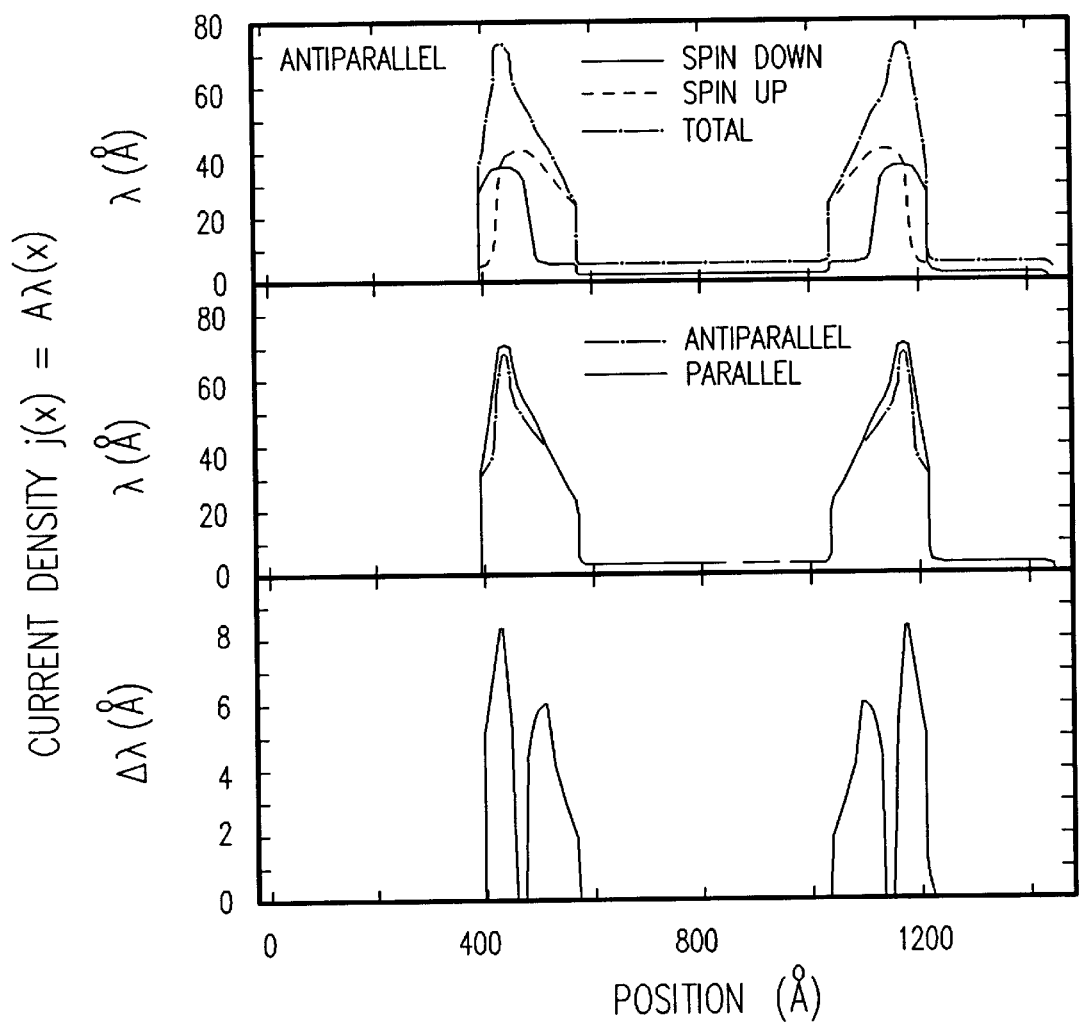
FIG. 7 is a set of three related graphs illustrating calculated sensor current density vs. position across the sensor for the dual magnetoresistive sensor shown in FIGS. 5 and 6.

A series of three related graphs which show the calculated sensor current density vs. position across the sensor for the dual MR sensor shown in FIGS. 5 and 6 is shown in FIG. 7. This specific embodiment of the dual MR sensor 90 has the structure, NiO(400 Å)/Co(30 Å)/Ru(6 Å)/Co(40 Å)/Cu(25 Å)/Co(20 Å)/NiFe(70 Å)/Ta(500 Å)NiFe(70 Å)/Co(20 Å)/Cu(25 Å)/Co(20 Å)/NiFe(30 Å)/FeMn(200 Å). In the top graph, an antiparallel alignment between the free and pinned layers is assumed. The spin up curve is shown as a dashed line, the spin down curve is shown as a solid line and the total current density is shown as a dot-dash line. The middle graph shows the total current density for both antiparallel alignment (dashed line) and parallel alignment (solid line), and the bottom curve shows the difference between the two curves illustrated by the middle graph.

Figure 8:
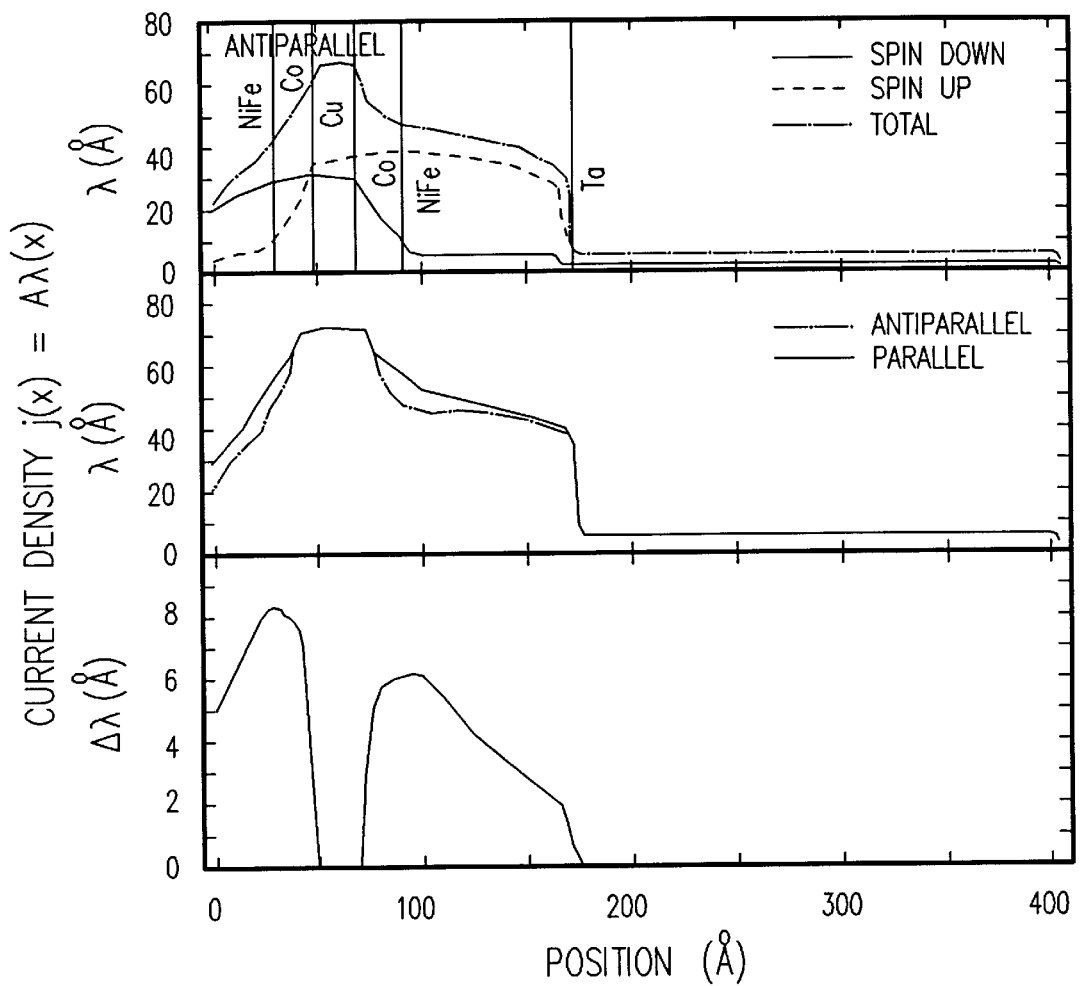
FIG. 8 is an expanded view of a portion of the graphs shown in FIG. 7.

FIG. 8 is an expanded graph which illustrates the current density for one spin valve structure of the FIG. 7 embodiment. This graph starts after the NiO layer and shows the contribution of each layer to the total current density for the spin valve structure. The graphs shown in FIGS. 7 and 8 are representative valves and serve to illustrate the operation of the spin valve sensor. The valves for a particular embodiment will vary as a function of the thickness and materials of the various layers in the spin valve structure.

Figure 9:
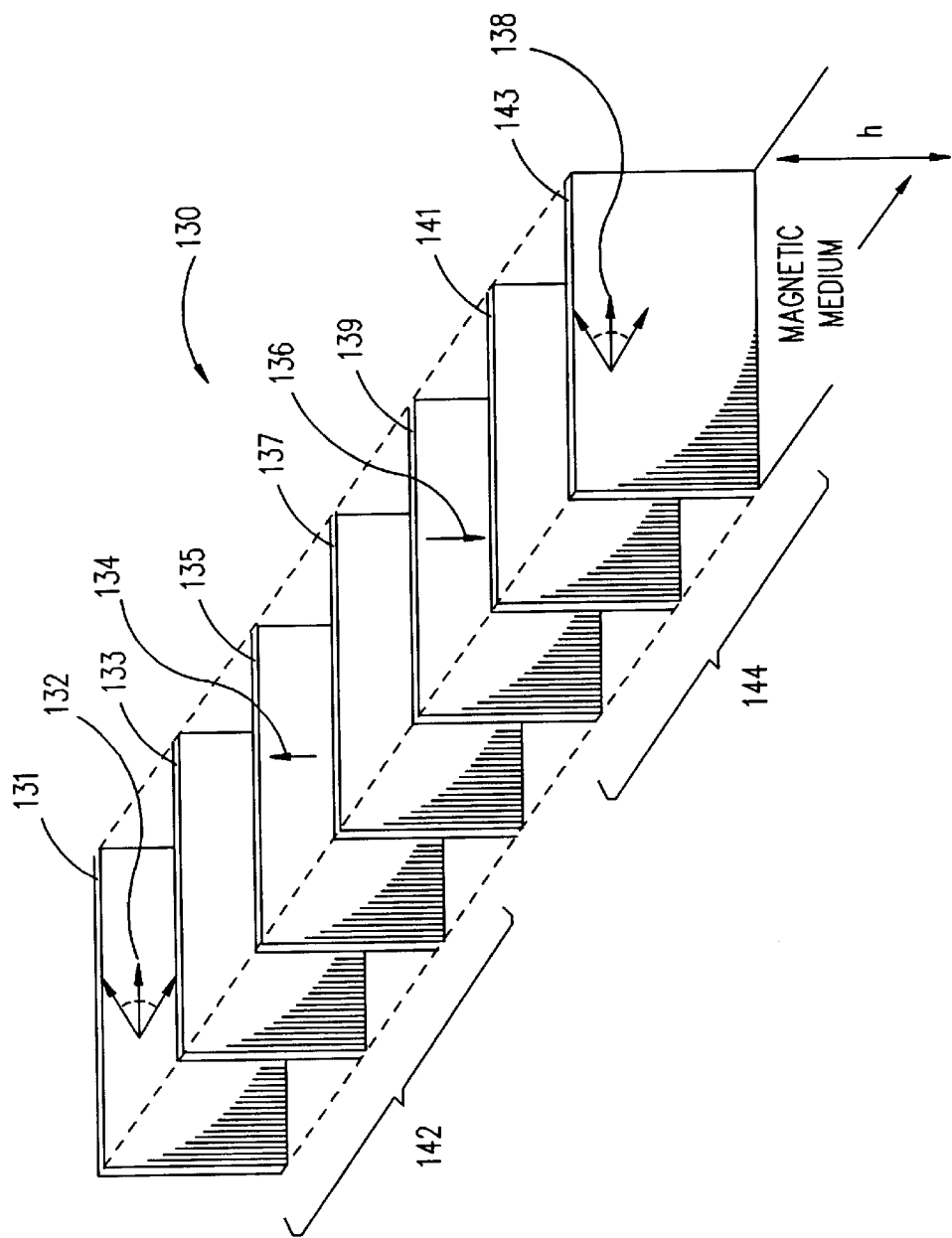
FIG. 9 is an exploded view in perspective of another embodiment of the dual magnetoresistive sensor according to the principles of the present invention.
Figure 10:
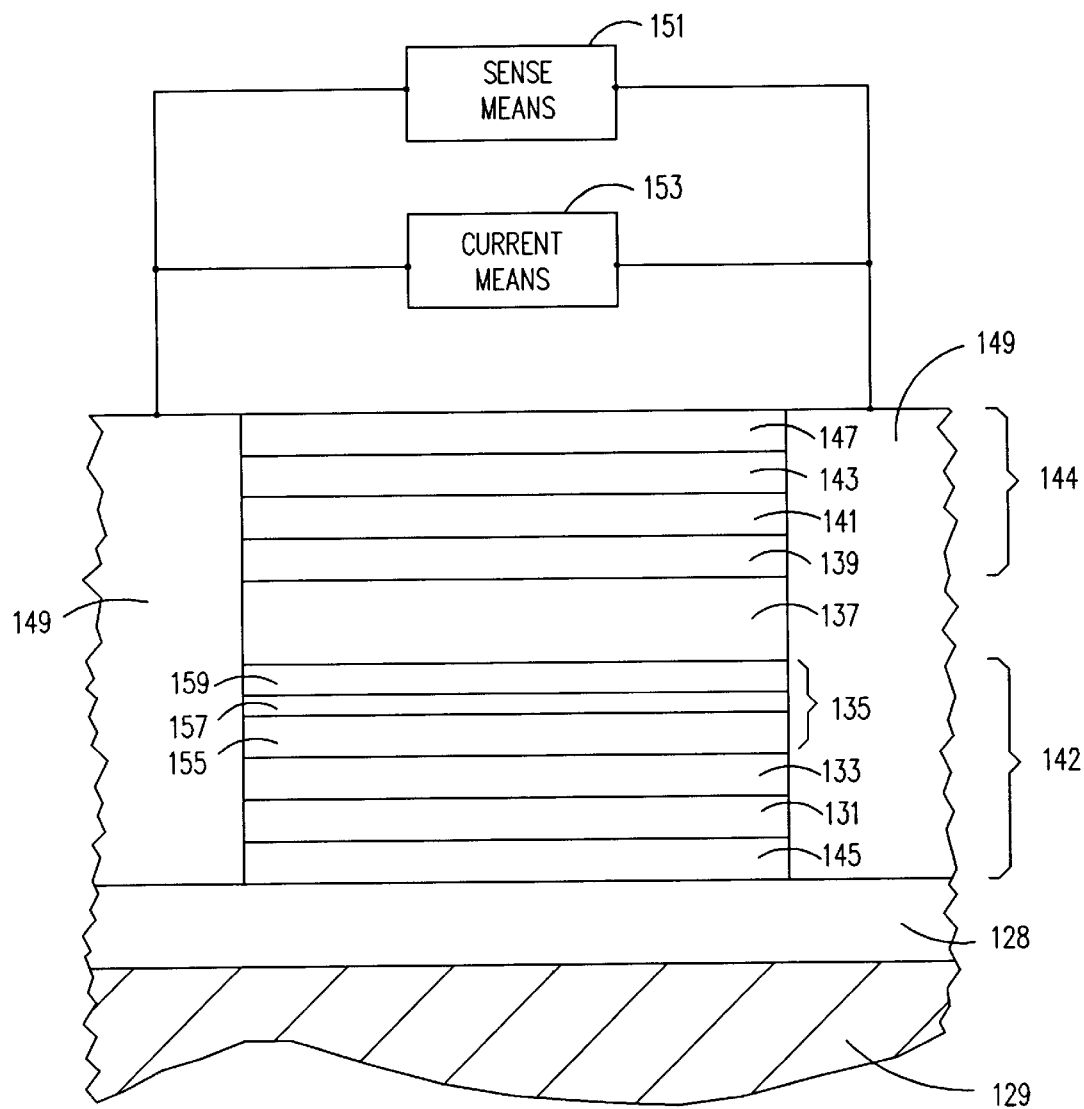
FIG. 10 is an end view from the sensor air bearing surface of the embodiment of the dual magnetoresistive sensor shown in FIG. 9.

Referring now to FIGS. 9 and 10, another preferred embodiment of an MR sensor according to the present invention is shown. The dual MR sensor 130 includes a first 142 and a second 144 spin valve structure separated by an insulating spacer layer 137.

In this embodiment of the dual MR sensor the first or free layers 131, 143 of ferromagnetic material of the spin valves 142, 144 are deposited at the ends (or top and bottom) of the structure while the second or pinned layers 135, 139 of ferromagnetic material are deposited near the middle of the layered structure adjacent opposing sides of the insulating spacer layer 137. The insulating spacer layer 137 is of an antiferromagnetic material which serves to fix the magnetization in the pinned layers 135, 139 by exchange coupling. This arrangement produces a more efficient current distribution within the sensor 130, as will be discussed below.

The spin valve structures 142 and 144 are deposited on a suitable substrate 129 and isolation layer 128. A suitable underlayer 145, such as Ta, Ru or CrV, for example, may be deposited on isolation layer 128 prior to the deposition of the first ferromagnetic layer 131. The purpose of underlayer 145 is to optimize the texture, grain size and morphology of the subsequent layers. Should the isolation layer 128 be of a material having suitable characteristics, the underlayer 145 can be omitted. Deposition of the first nonmagnetic conductive spacer layer 133 and the second ferromagnetic layer 135 completes the first spin valve structure 142. The antiferromagnetic spacer layer 137 is then deposited on and in contact with the second ferromagnetic layer 135. In this embodiment, the magnetization direction of the second layer of ferromagnetic material 135 is fixed in position by the spacer film layer 137 of antiferromagnetic material by exchange coupling as shown by arrow 134 in FIG. 9.

The second spin valve structure 144 comprises a third layer (pinned layer) 139 of ferromagnetic material formed on and in contact with the antiferromagnetic spacer layer 137, a second thin film spacer layer of nonmagnetic conductive material 141 and a fourth layer (free layer) 143 of ferromagnetic material. In this embodiment, the magnetization direction of the third layer of ferromagnetic material 139 is fixed by exchange coupling with the antiferromagnetic spacer layer 137, as shown by arrow 136 in FIG. 9.

As described above with reference to FIG. 6, the pinned layer 135 for the first spin valve 142 comprises first and second ferromagnetic layers 155, 159 separated by a thin nonmagnetic decoupling layer 157. This structure for the pinned layer 135 allows the desired antiparallel magnetization directions in the pinned layers 135, 139 to be achieved using a single antiferromagnetic layer 137 and a single heating/cooling process.

The ferromagnetic layers 131, 135, 139, 143 can be of any suitable magnetic material such as Co, Fe, Ni and their alloys such as NiFe, NiCo and FeCo, for example, with the layered pinned layer 135 being as described above. Alternatively, the ferromagnetic layers 131, 135, 139, 143 can include a nanolayer of a different ferromagnetic material as described above with reference to FIG. 6. The nonmagnetic conductive layers 133, 141 comprise Cu, for example, or other suitable conductive metals such as Ag, Au or their alloys. The insulating spacer layer 137 comprises any suitable antiferromagnetic material having a high electrical resistivity, such as NiO.

Electrical conductor leads 149 are provided to form a circuit path between the dual MR sensor 130, a current source 153 and a sensing means 151. As described above with reference to FIG. 6, the conductor leads 149 short the two spin valve structures 142, 144 together at each end and define the sensor 130 central active region and track width. It will be recognized by those skilled in the art that the dual MR sensor 130 may also include various other layers such as a capping layer 147 of Ta and biasing layers (not shown) such as a longitudinal bias layer(s), for example.

FIG. 9 illustrates that the magnetizations of the free layers 131, 143 of ferromagnetic material are oriented parallel to each other, i.e., in the same direction, and at an angle of about 90° with respect to the magnetization direction of the pinned layers 135, 139 of ferromagnetic material in the absence of an externally applied magnetic field as indicated by arrows 134 and 136. Thus, while the magnetization directions of the pinned layers 135, 139 of ferromagnetic material remain fixed, the magnetizations in the free layers 131, 143 of ferromagnetic material are free to rotate their direction in response to an externally applied magnetic field (such as magnetic field h as shown in FIG. 9), as shown by the dashed arrows 132, 138 on free layers 131 and 143, respectively.

Figure 11:
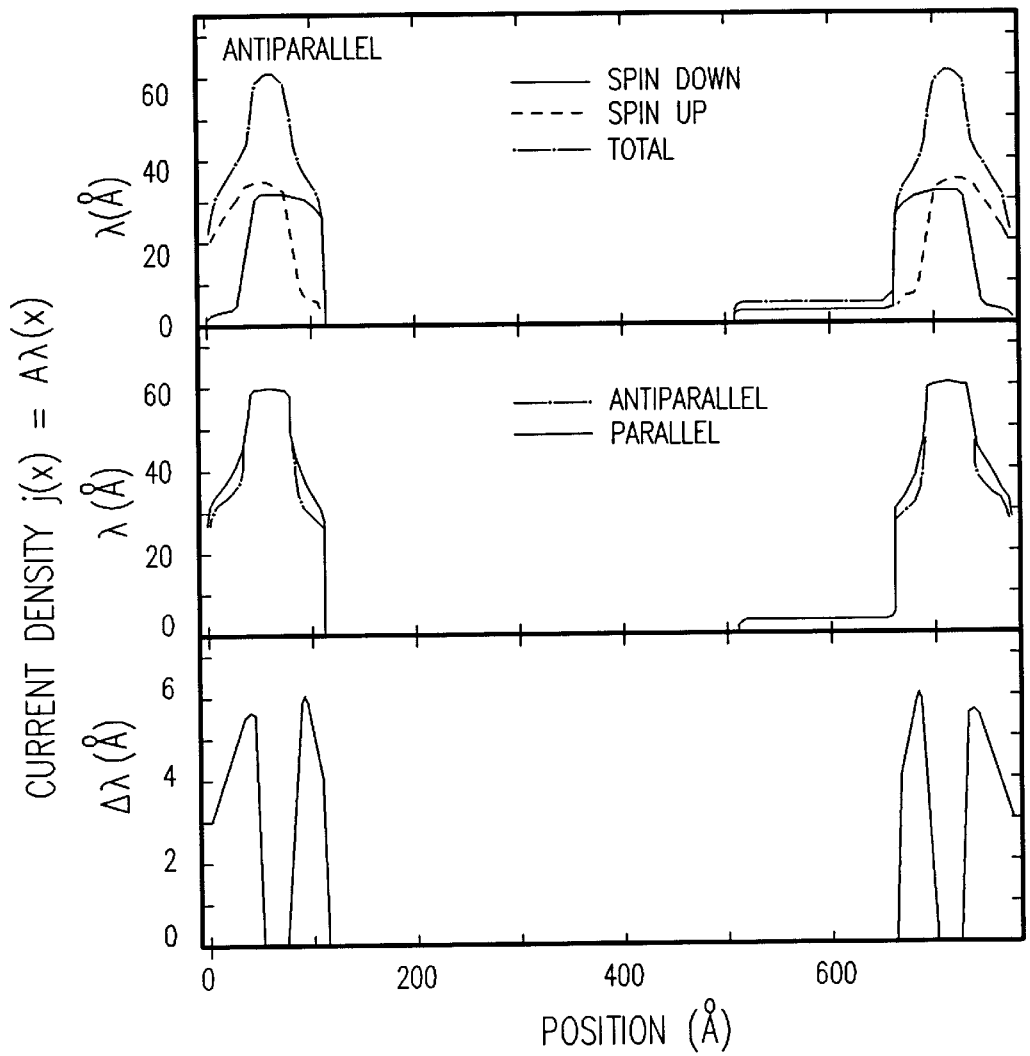
FIG. 11 is a set of three related graphs illustrating calculated sensor current density vs. position across the sensor for the dual magnetoresistive sensor shown in FIGS. 9 and 10.

A series of three related graphs which illustrate the calculated sensor current density vs. position across the sensor for the MR sensor shown in FIGS. 9 and 10 is shown in FIG. 11. A specific embodiment of the MR sensor has the structure, Ta(50 Å)/NiFe(50 Å)/Cu(25 Å)/Co(40 Å)/Ru(6 Å)/Co(30 Å)/NiO(400 Å)/Co(50 Å)/Cu(25 Å)/NiFe(50 Å)/Ta(50 Å). In the top graph, an antiparallel alignment between the free and pinned layers is -:assumed. The spin up curve is shown in dashed line, the spin down curve is shown in solid line and the total current density is shown in a dot dash line. The middle graph shows the total current density for both antiparallel alignment (dashed line) and parallel alignment (solid line), and the bottom curve shows the difference between the two curves illustrated by the middle graph.

There is a significant difference in the operation of the sensor when the free layers are located near the center of the dual MR sensor (as shown in FIGS. 5 and 6) and when the free layers are located near the edges of the dual MR sensor (as shown in FIGS. 9 and 10). The magnetic field generated by the sense current flowing through the sensor during operation acts differently on the free layers in the two cases. This magnetic field is included (along with the magnetostatic field of the pinned layer and the interlayer coupling, as well as any other effective or real fields acting on the free layer) when determining the correct current to use to properly bias the sensor for its most symmetrical operation and highest signal output.

When the free layers are near the center of the sensor, more of the sense current flows on both sides of each of the free layers. Since the field generated by the current flowing on one side of a given free layer counteracts the field generated by the current flowing on the opposite side, a smaller net field is produced by the current when the free layers are near the center of the MR structure. When the free layers are located near the outer edges of the sensor structure, the field acting on the free layers produced by the current is larger. Depending on the sun of the other magnetic fields acting on the free layer, one or the other of the embodiments is preferred. For pinned layers having a magnetic moment greater than the equivalent moment for a 25 Å thick layer of $NiR_{80}Fe_{20}$, or for structures wherein the ferromagnetic coupling between the free and pinned layers is greater than about 10 Oe, the MR structure shown in FIGS. 5 and 6 is preferred. Otherwise, the MR structure shown in FIGS. 9 and 10 is preferred. The optimum structure to be used is determined, in part, by the total magnetic field generated by the sense current. The current density in the sensor structure can be calculated as shown in FIGS. 7, 8 and 11. A convenient measure of the balance of the field generated by the current to the right and to the left of the free layers is 'Q', the fraction of the field that would be present if all of the current were to one side of the free layer. The value of 'Q' will be a function of the layer thicknesses, the choice of materials and the preparation conditions. For example, a value of Q=0.85 is obtained for a typical structure as shown in FIGS. 9 and 10, while a value of Q=0.36 is obtained for a typical structure as shown in FIGS. 5 and 6. The influence of the shields on the balance of fields is also important, as is known in the art, and must also be included in any micromagnetic modeling.

While the present invention has been particularly shown and described with reference to preferred embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the appended claims.

We claim:

1. A magnetic disk recording system comprising:

a magnetic storage medium having a plurality of tracks for recording of data;

a magnetic transducer maintained in a closely spaced position relative to said magnetic storage medium during relative motion between said magnetic transducer and said magnetic storage medium, said magnetic transducer including a magnetoresistive read sensor, said magnetoresistive read sensor comprising:

a first spin valve structure, comprising:

a first ferromagnetic free layer;

a first ferromagnetic pinned layer, said first pinned layer including a first and a second layer of ferromagnetic material separated from each other by an antiferromagnetic coupling layer, wherein said first pinned layer is the only pinned layer in said magnetoresistive read sensor having an antiferromagnetic coupling layer;

a first nonmagnetic conductive spacer layer disposed between said first ferromagnetic free layer and said first ferromagnetic pinned layer; and a first layer of antiferromagnetic material in direct contact with said second layer of ferromagnetic material in said first pinned layer for fixing the magnetization direction of said first pinned layer;

a second spin valve structure, comprising:
a second ferromagnetic free layer;
a second ferromagnetic pinned layer;
a second nonmagnetic conductive spacer layer disposed between said second free layer and said second pinned layer; and
a second layer of antiferromagnetic material in direct contact with said second pinned layer for fixing the magnetization direction of said second pinned layer;

a nonmagnetic insulating spacer layer disposed between said first and second spin valve structures;

a first and a second current source for producing current flows through said magnetoresistive sensor; and said magnetoresistive read sensor producing variations in its resistivity in response to an external magnetic field due to rotation of the magnetization in said free layers of ferromagnetic material in each of said first and second spin valve structures;

actuator means coupled to said magnetic transducer for moving said magnetic transducer to selected tracks on said magnetic storage medium; and a recording channel coupled to said magnetoresistive read sensor for detecting resistance changes in said magnetoresistive read sensor responsive to magnetic fields representative of data bits recorded in said magnetic storage medium intercepted by said magnetoresistive read sensor.

2. The magnetic disk recording system of claim 1 wherein said nonmagnetic insulating spacer layer comprises Al2O3.

3. The magnetic disk recording system of claim 1 wherein said nonmagnetic insulating spacer layer comprises SiO2.

4. The magnetic disk recording system of claim 1 wherein each of said first and second spin valve structures further comprising electrical conductor leads formed at opposite ends of said first and second spin valve structures for coupling each of said first and second spin valve structures to said respective ones of said first and second current sources.

5. The magnetic disk recording system of claim 4 wherein said first and second current sources are coupled to said first and second spin valve structures, respectively, each of said first and second spin valve structures coupled to different input terminals of a differential amplifier circuit.

6. The magnetic disk recording system of claim 1 wherein the first and second layers of ferromagnetic material of said first ferromagnetic pinned layer comprise cobalt.

7. The magnetic disk recording system of claim 1 wherein said antiferromagnetic coupling layer in said first spin valve structure comprises ruthenium.

8. The magnetic disk recording system of claim 1 wherein said antiferromagnetic coupling layer in said first spin valve structure is selected from a group of material consisting of ruthenium, chromium, rhodium and iridium.

9. A dual magnetoresistive read sensor comprising:
a first spin valve structure, comprising:
a first ferromagnetic free layer;
a first ferromagnetic pinned layer, said first pinned layer including a first and a second layer of ferromagnetic material separated from each other by an antiferromagnetic coupling layer, wherein said first pinned layer is the only pinned layer in said magnetoresistive read sensor having an antiferromagnetic coupling layer;
a first nonmagnetic conductive spacer layer disposed between said first ferromagnetic free layer and said first ferromagnetic pinned layer; and
a first layer of antiferromagnetic material in direct contact with said second layer of ferromagnetic material in said first pinned layer for fixing the magnetization direction of said first pinned layer;

a second spin valve structure, comprising:
a second ferromagnetic free layer;
a second ferromagnetic pinned layer;
a second nonmagnetic conductive spacer layer disposed between said second free layer and said second pinned layer; and
a second layer of antiferromagnetic material in direct contact with said second pinned layer for fixing the magnetization direction of said second pinned layer; and a nonmagnetic insulating spacer layer disposed between said first and second spin valve structures.

10. The dual magnetoresistive sensor of claim 9 wherein said nonmagnetic insulating spacer layer comprises Al2O3.

11. The dual magnetoresistive sensor of claim 9 wherein said nonmagnetic insulating spacer layer comprises SiO2.

12. The dual magnetoresistive sensor of claim 9 wherein said first and second layers of ferromagnetic material of said first ferromagnetic pinned layer comprise cobalt.

13. The dual magnetoresistive sensor of claim 9 wherein said antiferromagnetic coupling layer comprises ruthenium.

14. The dual magnetoresistive sensor of claim 9 wherein said antiferromagnetic coupling layer is selected from a group of material consisting of ruthenium, chromium, rhodium and iridium.

15. A dual magnetoresistive read sensor comprising:
a first spin valve structure, comprising:
a first ferromagnetic free layer;
a first ferromagnetic pinned layer, said first pinned layer including a first and a second layer of ferromagnetic material separated from each other by an antiferromagnetic coupling layer;
a first nonmagnetic conductive spacer layer disposed between said first ferromagnetic free layer and said first ferromagnetic pinned layer; and
a first layer of antiferromagnetic material in direct contact with said second layer of ferromagnetic material in said first pinned layer for fixing the magnetization direction of said first pinned layer;

a second spin valve structure, comprising:
a second ferromagnetic free layer;
a second ferromagnetic pinned layer;
a second nonmagnetic conductive spacer layer disposed between said second free layer and said second pinned layer; and
a second layer of antiferromagnetic material in direct contact with said second pinned layer for fixing the magnetization direction of said second pinned layer;

a nonmagnetic insulating spacer layer disposed between said first and second spin valve structures; and said first pinned layer of said first spin valve structure is the only pinned layer in said magnetoresistive read sensor having an antiferromagnetic coupling layer.

16. A magnetic disk recording system comprising:

a magnetic storage medium having a plurality of tracks for recording of data;

a magnetic transducer maintained in a closely spaced position relative to said magnetic storage medium during relative motion between said magnetic transducer and said magnetic storage medium, said magnetic transducer including a magnetoresistive read sensor, said magnetoresistive read sensor comprising:

a first spin valve structure, comprising:
   a first ferromagnetic free layer;
   a first ferromagnetic pinned layer, said first pinned layer including a first and a second layer of ferromagnetic material separated from each other by an antiferromagnetic coupling layer;
   a first nonmagnetic conductive spacer layer disposed between said first ferromagnetic free layer and said first ferromagnetic pinned layer; and
   a first layer of antiferromagnetic material in direct contact with said second layer of ferromagnetic material in said first pinned layer for fixing the magnetization direction of said first pinned layer;

a second spin valve structure, comprising:
   a second ferromagnetic free layer;
   a second ferromagnetic pinned layer;
   a second nonmagnetic conductive spacer layer disposed between said second free layer and said second pinned layer; and
   a second layer of antiferromagnetic material in direct contact with said second pinned layer for fixing the magnetization direction of said second pinned layer;

a nonmagnetic insulating spacer layer disposed between said first and second spin valve structures; and said first pinned layer of said first spin valve structure is the only pinned layer in said magnetoresistive read sensor having an antiferromagnetic coupling layer;

a first and a second current source for producing current flows through said magnetoresistive read sensor;

said magnetoresistive read sensor producing variations in its resistivity in response to an external magnetic field due to rotation of the magnetization in said free layers of ferromagnetic material in each of said first and second spin valve structures;

actuator means coupled to said magnetic transducer for moving said magnetic transducer to selected tracks on said magnetic storage medium; and a recording channel coupled to said magnetoresistive read sensor for detecting resistance changes in said magnetoresistive read sensor responsive to magnetic fields representative of data bits recorded in said magnetic storage medium intercepted by said magnetoresistive read sensor.

\* \* \* \* \*

UNITED STATES PATENT AND TRADEMARK OFFICE
CERTIFICATE OF CORRECTION

PATENT NO. : 6,055,136
DATED : April 25, 2000
INVENTOR(S) : H. S. Gill et al.

It is certified that error appears in the above-indentified patent and that said Letters Patent is hereby corrected as shown below:

Column 8, line 64, delete "layer Si as shown" and insert --layer S1 as shown--.

Signed and Sealed this

Tenth Day of April, 2001

Attest:

NICHOLAS P. GODICI

Attesting Officer    Acting Director of the United States Patent and Trademark Office